United States Patent
Kang

(10) Patent No.: US 8,358,162 B2
(45) Date of Patent: Jan. 22, 2013

(54) BUFFER CIRCUIT AND DUTY CYCLE CORRECTION METHOD USING SAME

(75) Inventor: Kyoung Tae Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 124 days.

(21) Appl. No.: 13/050,414

(22) Filed: Mar. 17, 2011

(65) Prior Publication Data

US 2011/0227622 A1    Sep. 22, 2011

(30) Foreign Application Priority Data

Mar. 17, 2010 (KR) .................. 10-2010-0023812

(51) Int. Cl.
*H03K 3/017* (2006.01)

(52) U.S. Cl. ............... 327/175; 327/165; 327/172

(58) Field of Classification Search ........ 327/172–176, 327/165, 166, 298–299
See application file for complete search history.

(56) References Cited

U.S. PATENT DOCUMENTS 6,424,178 B1 *   7/2002   Harrison ................ 326/93
7,205,799 B2     4/2007   Kim et al.
7,525,359 B2 *   4/2009   Kim ..................... 327/175

FOREIGN PATENT DOCUMENTS

| KR | 1020000000993 A | 1/2000 |
| KR | 1020060026509 A | 3/2006 |
| KR | 1020080075415 A | 8/2008 |

* cited by examiner

*Primary Examiner* — An Luu
(74) *Attorney, Agent, or Firm* — Volentine & Whitt, PLLC

(57) ABSTRACT

A buffer circuit includes an amplifier circuit amplifying a difference between an input signal and a reference signal, providing a branch current that varies with a duty cycle of the input signal, and outputting a preliminary output signal on the basis of the amplified difference. The buffer circuit also includes a charge pump circuit charging/discharging a control node in response to the branch current to provide a control signal. The buffer circuit also includes a driver circuit configured to control pull-up strength and pull-down strength for the preliminary output signal based on control signal to thereby correct the duty cycle of the preliminary output signal in relation to a target duty cycle.

17 Claims, 10 Drawing Sheets

BUFFER CIRCUIT AND DUTY CYCLE CORRECTION METHOD USING SAME

CROSS-REFERENCE TO RELATED APPLICATIONS

This application claims the benefit of Korean Patent Application No. 10-2010-0023812 filed on Mar. 17, 2010, the subject matter of which is hereby incorporated by reference.

BACKGROUND OF THE INVENTION

Embodiments of the inventive concept relate to buffer circuits (hereafter "buffers"), and more particularly buffers capable of correcting duty cycle distortions in an input signal. Embodiments of the inventive concept also relate to duty cycle correction methods using this type of buffers.

Buffers are routinely incorporated into the circuitry of various semiconductor devices (e.g., semiconductor memory devices, such as dynamic random access memory devices or DRAM) for many different purposes. Among other functionality, buffers may be designed to amplify relatively small (or weak) signals, such as many high speed signals applied to semiconductor memory devices, and output CMOS (Complementary Metal-Oxide-Semiconductor) compatible signal having greater immunity to system noise. However, such buffers do not conventionally correct the duty cycle of distorted input signals. When the duty cycle offset of an input signal is not corrected by a buffer, a set margin and a hold margin are inevitably decreased in a device receiving (and subsequently processing) the output signal provided by the buffer. In extreme cases, a semiconductor device may malfunction due to a duty cycle offset accumulated while an output signal of the buffer is being processed.

SUMMARY OF THE INVENTION

Embodiments of the inventive concept provide a buffer correcting a duty cycle offset of an input signal and generating an output signal having a predetermined duty cycle. Embodiments of the inventive concept also provide a duty cycle correction method using this type of buffer.

In one embodiment, the inventive concept provides a buffer circuit comprising; an amplifier circuit receiving an input signal and a reference signal and configured to amplify a difference between the input signal and the reference signal, provide a branch current that varies with a duty cycle of the input signal, and output a preliminary output signal on the basis of the amplified difference, a charge pump circuit configured to charge or discharge a control node in response to a change in the branch current, wherein a voltage apparent at the control node is output as a control signal, and a driver circuit receiving the preliminary output signal and the control signal, and configured to control pull-up strength and pull-down strength for the preliminary output signal based on control signal to thereby correct a duty cycle of the preliminary output signal in relation to a target duty cycle for the input signal.

In a related aspect, the amplifier circuit may comprise; a constant current source configured to operate in response to a bias voltage internally generated in response to the reference signal, and an amplification unit configured to amplify the difference between the input signal and the reference signal.

In another related aspect, the charge pump circuit may be connected to a common node between the constant current source and the amplification unit to charge or discharge the control node in response to the change in the branch current.

In another related aspect, the amplifier circuit may comprise; a constant current source configured to operate in response to a bias voltage, and an amplification unit configured to amplify the difference between the input signal and the reference signal.

In another related aspect, the charge pump circuit may be connected to a common node between the constant current source and the amplification unit to charge or discharge the control node in response to the change in the branch current.

In another related aspect, the amplifier circuit may comprise; a first constant current source and a second constant current circuit configured to operate in response to a bias voltage internally generated in response to the reference signal, and an amplification unit configured to amplify the difference between the input signal and the reference signal.

In another related aspect, the charge pump circuit may comprise; a first charge pump connected to a first common node between the first constant current source and the amplification unit and configured to discharge the control node in response to the reference signal, and a second charge pump connected to a second common node between the second constant current source and the amplification unit and configured to charge the control node in response to the reference signal.

In another related aspect, the driver circuit may comprise; a first buffer element configured to control an inclination/declination of the preliminary output signal in response to the control signal and output an adjusted preliminary output signal, and at least one second buffer element configured to buffer the adjusted preliminary output signal and output an output signal.

In another related aspect, the driver circuit further may comprise; a pull-up controller configured to increase inclination of the preliminary output signal by increasing pull-up strength of the first buffer element in response to control signal, and a pull-down controller configured to increase declination of the preliminary output signal by increasing pull-down strength of the first buffer element in response to the control signal.

In another embodiment, the inventive concept provides a semiconductor memory device comprising at least one buffer circuit, wherein the at least one buffer circuit comprises; an amplifier circuit receiving an input signal and a reference signal and configured to amplify a difference between the input signal and the reference signal, provide a branch current that varies with a duty cycle of the input signal, and output a preliminary output signal on the basis of the amplified difference, a charge pump circuit configured to charge or discharge a control node in response to a change in the branch current, wherein a voltage apparent at the control node is output as a control signal, and a driver circuit receiving the preliminary output signal and the control signal, and configured to control pull-up strength and pull-down strength for the preliminary output signal based on control signal to thereby correct the duty cycle of the preliminary output signal in relation to a target duty cycle.

In another embodiment, the inventive concept provides buffer circuit comprising; an amplifier circuit receiving an input signal and a reference signal and configured to amplify a difference between the input signal and the reference signal, provide a branch current that varies with a duty cycle of the input signal, and output a preliminary output signal on the basis of the amplified difference, a duty control circuit configured to generate a control signal that varies with the branch current, and a driver circuit receiving the preliminary output signal and the control signal, and configured to control inclination/declination of the preliminary output signal in response to the control signal to correct the a duty cycle of the preliminary output signal in relation to a target duty cycle for the input signal.

In a related aspect, the amplifier circuit may comprise; a constant current source configured to operate in response to an external bias voltage or a bias voltage internally generated in response to the reference signal, and an amplification unit configured to amplify the difference between the input signal and the reference signal, wherein the duty control circuit is connected to a common node between the constant current source and the amplification unit to generate the control signal based on a change of a branch current in the amplification unit that varies in relation to the duty cycle of the input signal.

In another related aspect, the duty control circuit may comprise; a charge pump circuit configured to charge or discharge a control node in response to the branch current, wherein the control signal is generated in response to a voltage apparent at the control node.

In another related aspect, the duty control circuit may further comprise; a voltage detector receiving the voltage apparent at the control node and configured to output a detected control voltage signal, and a control signal generator receiving the detected control voltage signal and configured to output a digital control signal indicative of the detected control voltage signal.

In another related aspect, the driver circuit may comprise; a pull-up controller operating in response to the digital control signal to control declination of the preliminary output signal, and a pull-down controller operating in response to the digital control signal to control inclination of the preliminary output signal.

In another embodiment, the inventive concept provides a method of correcting a duty cycle using a buffer circuit receiving an input signal and a reference signal, the method comprising; amplifying a difference between the input signal and the reference signal to generate a preliminary output signal, generating a branch current that varies with a duty cycle of the input signal, and charging or discharging a control node in response to the branch current, generating a control signal from a voltage apparent at the control node, and correcting a duty cycle for the preliminary output signal in relation to a target duty cycle for the input signal by controlling pull-up strength and pull-down strength of the preliminary output signal in response to the control signal.

In another embodiment, the inventive concept provides an electronic system comprising; a central processing unit providing an input signal to a semiconductor memory device via a bus, the semiconductor memory comprising at least one buffer circuit receiving the input signal, wherein the buffer circuit comprises, an amplifier circuit receiving the input signal and a reference signal and configured to amplify a difference between the input signal and the reference signal, provide a branch current that varies with a duty cycle of the input signal, and output a preliminary output signal on the basis of the amplified difference, a charge pump circuit configured to charge or discharge a control node in response to a change in the branch current, wherein a voltage apparent at the control node is output as a control signal, and a driver circuit receiving the preliminary output signal and the control signal, and configured to control pull-up strength and pull-down strength for the preliminary output signal based on control signal to thereby correct the duty cycle of the preliminary output signal in relation to a target duty cycle.

BRIEF DESCRIPTION OF THE DRAWINGS

The above and other features and advantages of the inventive concept will become more apparent upon consideration of the detail description of certain exemplary embodiments thereof presented in the attached drawings in which.

DETAILED DESCRIPTION

Figure 1:
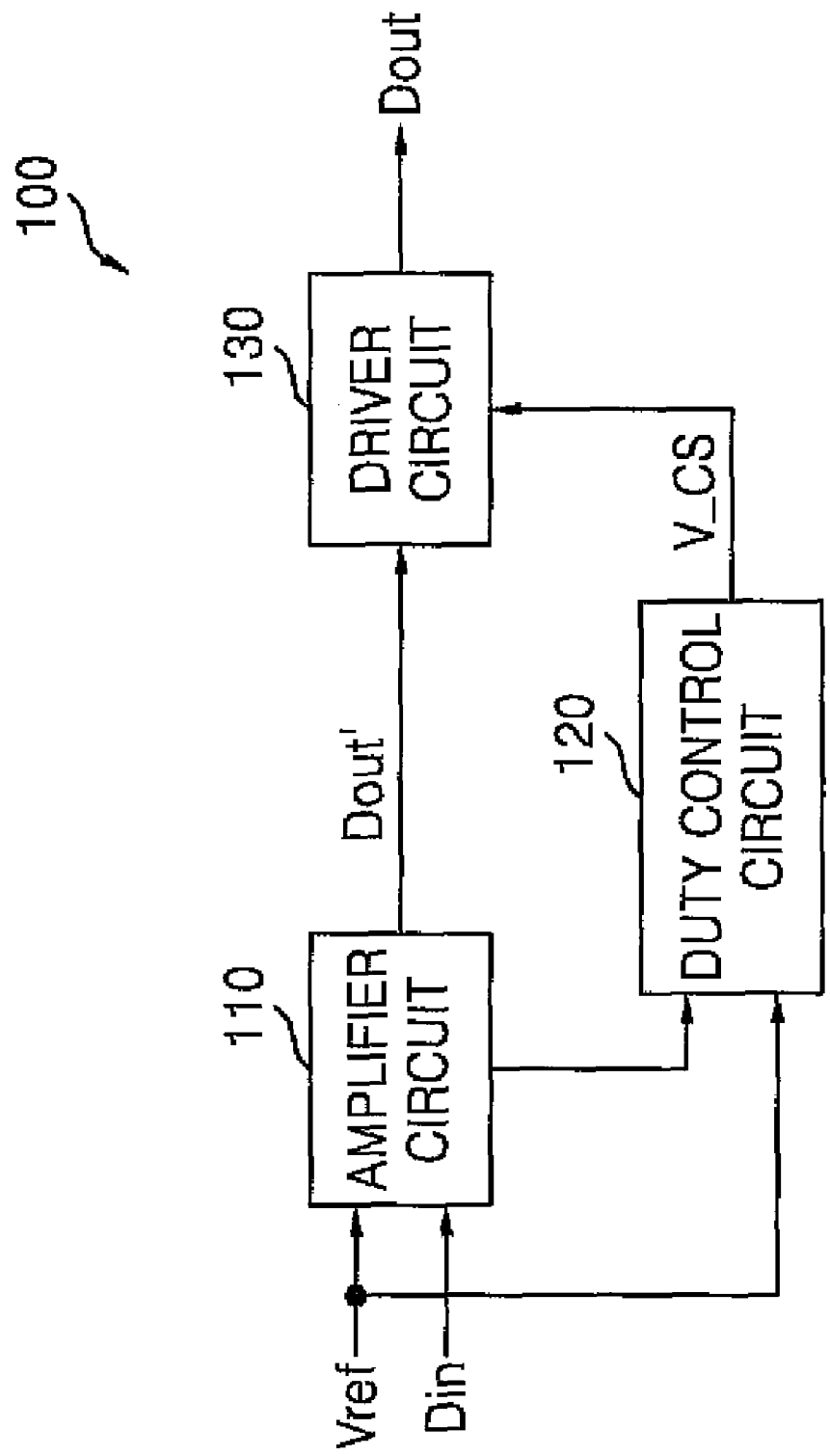
FIG. 1 is a block diagram of a buffer according to certain embodiments of the inventive concept.

The inventive concept now will be described more fully hereinafter with reference to the accompanying drawings in which certain embodiments of the inventive concept are shown. This inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. In the drawings and the written description, like reference numbers and labels are used to indicate like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a buffer circuit (hereafter, "buffer") 100 according to certain embodiments of the inventive concept. The buffer 100 is configured to correct duty cycle distortion for an input signal Din and generate an output signal Dout having a predetermined duty cycle.

The buffer 100 generally comprises an amplifier circuit 110, a duty control circuit 120, and a driver circuit 130. The amplifier circuit 110 receives the input signal Din and a reference signal Vref, and amplifies and outputs a difference between the input signal Din and reference signal Vref. This amplified difference will be referred to as a preliminary output signal Dout'.

The duty control circuit 120 generates a variable control signal based on a change (i.e., an increase or a decrease) in a branch current provided by the amplifier circuit 110, wherein the branch current varies in accordance with the duty cycle of the input signal Din. In certain embodiments, the duty control circuit 120 may be implemented using a charge pump circuit that charges or discharges a control node (not shown) according to an increase or a decrease in the branch current provided by the amplifier circuit 110. In response to the reference signal Vref and the branch current applied as input, the duty control circuit 120 generates a control signal (e.g., voltage V_CS) from the control node, wherein the level of the control signal varies in relation to the duty cycle of the input signal Din and may be used to correct the duty cycle of the preliminary output signal Dout' generated by the amplifier circuit 110.

The driver circuit 130 receives the preliminary output signal Dout' from the amplifier circuit 110, controls the inclination or declination of the preliminary output signal Dout' based on the control signal, and buffers a resulting output signal Dout. In this manner, the duty cycle of the resulting output signal Dout may be controlled (e.g., its inclination or declination changed) according to the control signal. That is, the inclination of the preliminary output signal Dout' may be controlled based on a change in the pull-up strength of the driver circuit 130, and the declination of the preliminary output signal Dout' may be controlled based on a change in the pull-down strength of the driver circuit 130.

Figure 2:
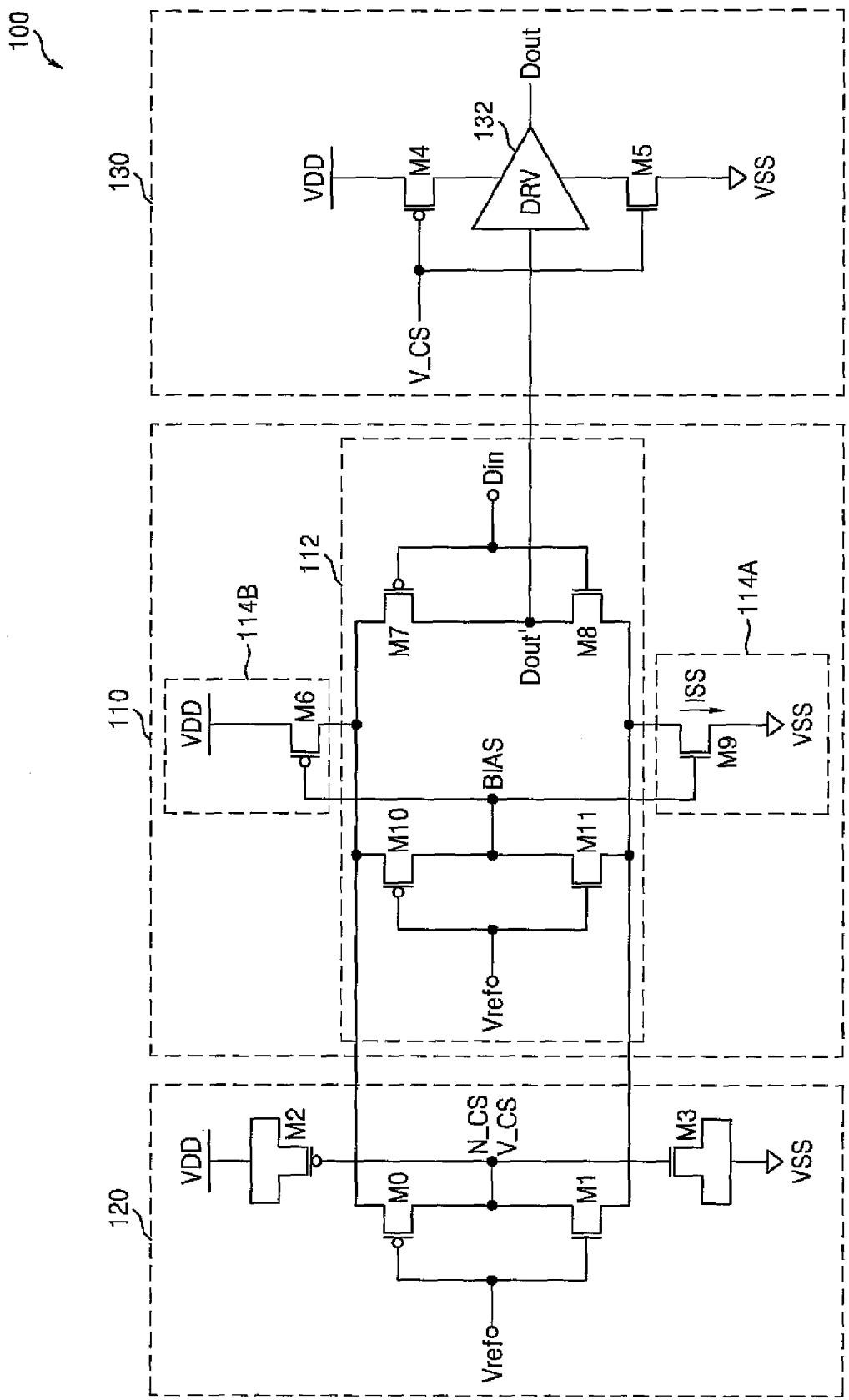
FIG. 2 is a circuit diagram further illustrating the buffer of in FIG. 1.

FIG. 2 is a circuit diagram further illustrating the buffer 100 of FIG. 1. Referring to FIG. 2, the amplifier circuit 110 may be generally implemented as a Bazes type amplifier that generates a bias voltage BIAS in relation to the reference signal Vref. However, other embodiments the inventive concept may be implemented using other types of amplifiers. For instance, the amplifier circuit 110 may be implemented using a differential type amplifier.

The amplifier circuit 110 illustrated in FIG. 2 comprises a first constant current source 114A, a second constant current source 114B, and an amplification unit 112. The first constant current source 114A and the second constant current source 114B generate a constant bias current ISS based on the bias voltage BIAS generated in relation to the reference signal Vref.

The first constant current source 114A may be implemented by an N-type metal-oxide semiconductor (NMOS) transistor M9 operating in response to the bias voltage BIAS. The second constant current source 114B may be implemented by a P-type MOS (PMOS) transistor M6 operating in response to the bias voltage BIAS. The reference signal Vref will typically have a level within a predetermined voltage range.

The amplification unit 112 amplifies the voltage difference between the input signal Din and the reference signal Vref using the bias current ISS generated by the first and second constant current sources 114A and 114B as a driving current. In other words, the amplification unit 112 differentially amplifies the input signal Din and the reference signal Vref, and outputs an amplification result as the preliminary output signal Dout'.

In the illustrated embodiment, the amplification unit 112 comprises a pair of MOS transistors M7 and M8 that operate in response to the input signal Din and a pair of MOS transistors M10 and M11 that operate in response to the reference signal Vref.

The input signal Din exhibits a duty cycle that is the subject of the duty cycle correction provided by the buffer 100. Thus, the reference signal Vref is not really an "input" signal for purposes of duty cycle correction, but instead is more accurately referred to as a reference signal. Accordingly, the amplification unit 112 may be said to differentially amplify the reference signal Vref and the input signal Din.

In the illustrated embodiment of FIG. 1, the charge pump circuit used as the duty control circuit 120 comprises a first charge pump M1, a second charge pump M0, a first capacitor M3, and a second capacitor M2. The first charge pump M1 is connected to a common node N_C1 between the first constant current source 114A and the amplification unit 112 and discharges a control node N_CS through a ground voltage line VSS in response to the reference signal Vref. The second charge pump M0 is connected to a common node N_C2 between the second constant current source 114B and the amplification unit 112 and charges the control node N_CS in response to the reference signal Vref. The amount of charge pumped by the first charge pump M1 and the second charge pump M0 may vary with the change of the duty cycle of the input signal Din.

When the duty cycle of the input signal Din is constant at, for example, 50% (e.g., wherein 50% is a "target duty cycle" for the input signal Din), a voltage V_CS of the control node N_CS is maintained constant due to the charge pumping of the first and second charge pumps M1 and M0 based on the reference signal Vref. Here, the term "duty cycle" defines a ratio of a high-level duration for the signal period.

However, when a branch current IB of the amplification unit 112 varies due to duty cycle distortion in the input signal Din, the control signal (voltage V_CS apparent at the control node N_CS) also varies. For instance, when the duty cycle of the input signal Din increases over 50%, a first branch current IB1 of the amplification unit 112 increases and a current IM1 decreases based on the charge discharged from the control node N_CS by the first charge pump M1 because the sum of the first branch current IB1, a second branch current IB2, and a current discharged by the charge pump circuit 120 is the bias current ISS that is constant and the second branch current IB2 based on the reference signal Vref is constant. As a result, the amount of charge provided by the second charge pump M0 is greater at the control node N_CS than the amount of charge provided by the first charge pump M1. As a result, the voltage V_CS of the control node N_CS increases.

Contrarily, when the duty cycle of the input signal Din decreases below 50%, the first branch current IB1 decreases and the current IM1 increases based on a charge discharged by the first charge pump M1 from the control node N_CS. As a result, the amount of charge provided by the second charge pump M0 is less at the control node N_CS than the amount of charge provided by the first charge pump M1. As a result, the voltage V_CS of the control node N_CS decreases.

Here, the term "duty cycle distortion" means any variance from a defined duty cycle (e.g., a duty cycle less than or greater than 50% in the working example). Thus, in the illustrated example, the buffer 100 corrects the duty cycle of the input signal Din when it varies from 50%, and generates the corresponding output signal Dout having the desired duty cycle of 50%. However, those skilled in the art will understand that any reasonable duty cycle may be similarly corrected by buffers designed in accordance with embodiments of the inventive concept.

Returning to FIG. 2, the first and second capacitors M3 and M2 function as a low-pass filter that filters high-frequency components out from the control signal (voltage V_CS apparent at the control node N_CS). In other words, the first and second capacitors M3 and M2 filter noise so that the control signal (voltage V_CS) as applied to the driver circuit 130 is essentially a direct current (DC) signal. Of further note, the first and second capacitors M3 and M2 may be implemented using conventionally understood and readily implemented CMOS processes.

In this manner, the driver circuit 130 corrects the duty cycle of the preliminary output signal Dout' provide from the amplifier circuit 110 in response to the control signal (voltage V_CS apparent at the control node N_CS) which varies in accordance with the charge pumping operation of the charge pump circuit 120.

Figure 3:
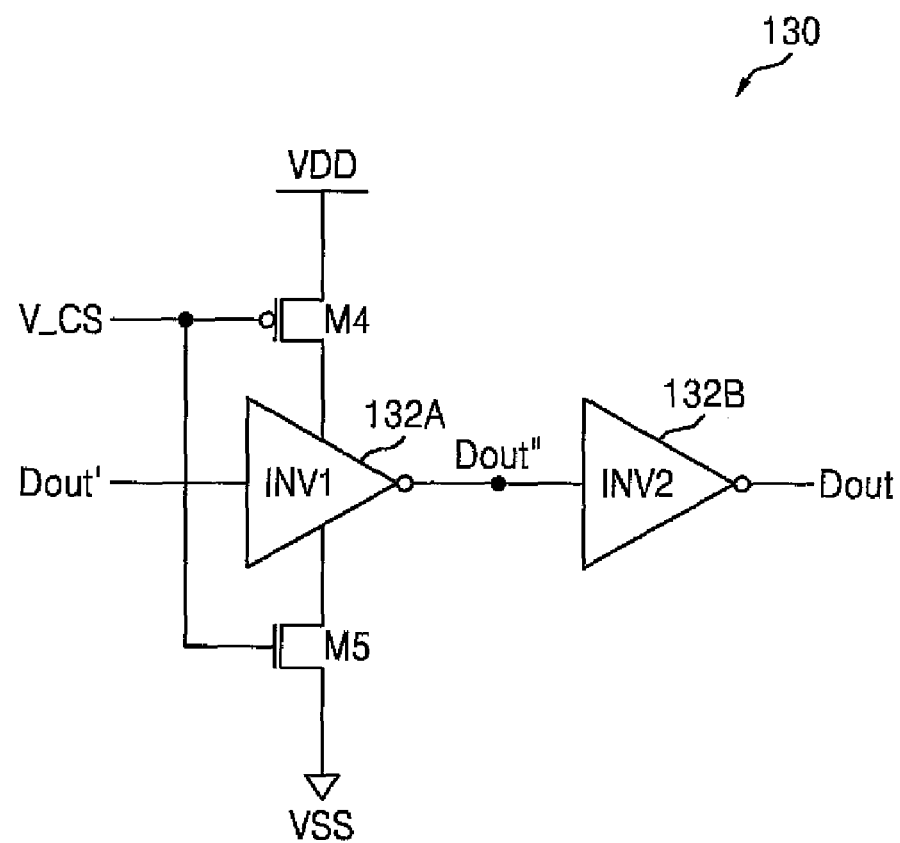
FIG. 3 is a circuit diagram further illustrating the driver circuit of FIG. 2.

FIG. 3 is a circuit diagram further illustrating one possible embodiment of the driver circuit 130 of FIG. 2. Referring to FIG. 3, the driver circuit 130 comprises a first buffer element 132A and a second buffer element 132B.

The first buffer element 132A controls the inclination/declination of the preliminary output signal Dout' provided by the amplifier circuit 110 based on the control signal (voltage V_CS apparent at the control node N_CS). The driver circuit 130 includes a pull-up controller M4 and a pull-down controller M5. FIG. 3 does not show fundamental pull-up and pull-down circuits of the first and second buffer elements 132A and 132B, but such circuits are well understood by those skilled in the art.

The pull-up controller M4 increases the pull-up strength of the preliminary output signal Dout' in response to the control signal (voltage V_CS apparent at the control node N_CS), thereby increasing the inclination of the preliminary output signal Dout'. The pull-down controller M5 increases the pull-down strength of the preliminary output signal Dout' in response to the control signal, thereby increasing the declination of the preliminary output signal Dout'.

For instance, when the control signal (voltage V_CS apparent at the control node N_CS) increases, the amount of charge provided by the first buffer element 132A is decreased by the pull-up controller M4, and the amount of charge discharged from the first buffer element 132A is increased by the pull-down controller M5. As a result, the declination of the adjusted preliminary output signal Dout" provided by the first buffer element 132A is increased. In contrast, when the control signal (voltage V_CS apparent at the control node N_CS) decreases, the amount of charge provided by the first buffer element 132A is increased by the pull-up controller M4, and the amount of charge discharged from the first buffer element 132A is decreased by the pull-down controller M5. As a result, the inclination of the adjusted preliminary output signal Dout" provided by the first buffer element 132A is increased. As illustrated in FIG. 3, the pull-up controller M4 may be implemented using a PMOS transistor operating in response to the control signal (voltage V_CS apparent at the control node N_CS) and the pull-down controller M5 may be implemented using an NMOS transistor operating in response to the same control signal.

The second buffer element 132B essentially buffers the adjusted preliminary output signal Dout" provided by the first buffer element 132A, thereby generating the output signal Dout having a corrected duty cycle. The duty control operation of the first and second buffer elements 132A and 132B is as follows: when the inclination of the preliminary output signal Dout' is increased by the first buffer element 132A, the duty cycle of the output signal Dout provide by the second buffer element 132B becomes higher than the duty cycle of the preliminary output signal Dout', but when the declination of the preliminary output signal Dout' is increased by the first buffer element 132A, the duty cycle of the output signal Dout from the second buffer element 132B becomes lower than the duty cycle of the preliminary output signal Dout'.

As suggested by the circuit illustrated in FIG. 3, the first and second buffer elements 132A and 132B may be implemented using inverters. Although not shown in FIG. 3, the driver circuit 130 may also include an inverter connected in series with the second buffer element 132B to sequentially output the adjusted preliminary output signal Dout" provide by the first buffer element 132A.

An exemplary duty cycle control mechanism for the buffer circuit 100 in both illustrated cases where the duty cycle of the input signal Din is lower than 50% and where the duty cycle of the input signal Din is higher than 50% will now be described.

When the duty cycle of the input signal Din is 35%, the control signal (voltage V_CS apparent at the control node N_CS) is less than that when the duty cycle of the input signal Din is 50%. Thus, the inclination of the adjusted preliminary output signal Dout" provided by the first buffer element 132A is increased by the pull-up controller M4. As a result, the duty cycle of the output signal Dout provided by the second buffer element 132B is greater than 35%.

When the duty cycle of the input signal Din is 65%, the control signal (voltage V_CS apparent at the control node N_CS) is greater than that when the duty cycle of the input signal Din is 50%. Thus, the declination of the adjusted preliminary output signal Dout" provided by the first buffer element 132A is increased by the pull-down controller M5. As a result, the duty cycle of the output signal Dout provided by the second buffer element 132B is less than 65%.

In the illustrated embodiments, a procedure in which the distortion of the duty cycle of a signal input to an amplifier circuit including two constant current sources operating based on an internal bias voltage is corrected has been described. However, the scope of the present inventive concept is not restricted to the use of only the particular elements described in the embodiments. In other embodiments of the present inventive concept, a buffer circuit may include a single constant current source using an internal bias voltage and an amplification unit, and a duty control circuit may be connected between the constant current source and the amplification unit and generate a control signal reflecting duty information of an input signal. In further embodiments of the present inventive concept, a buffer circuit may include a constant current source operating in response to an external bias voltage.

Figure 4:
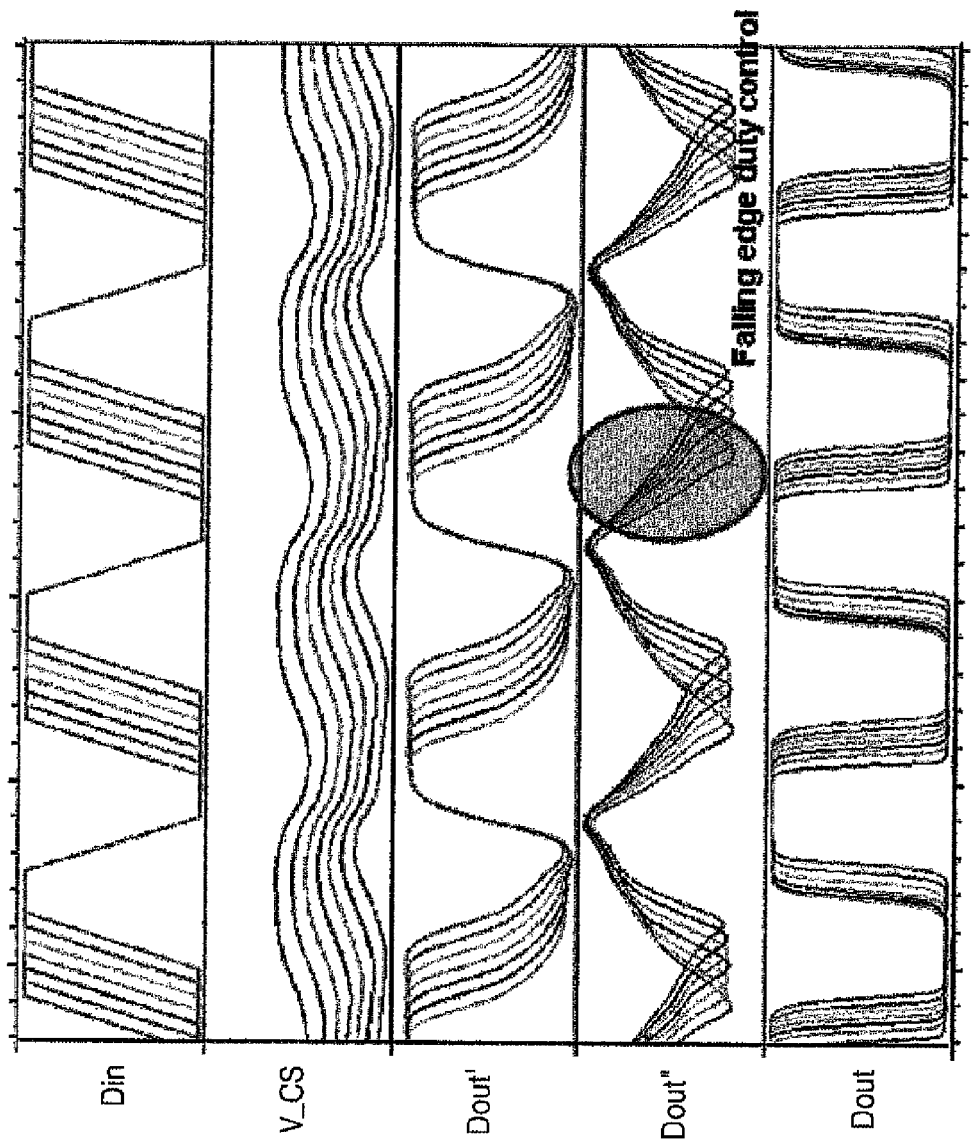
FIG. 4 is a timing diagram illustrating one possible mode of operation for the buffer of FIG. 2.
Figure 5:
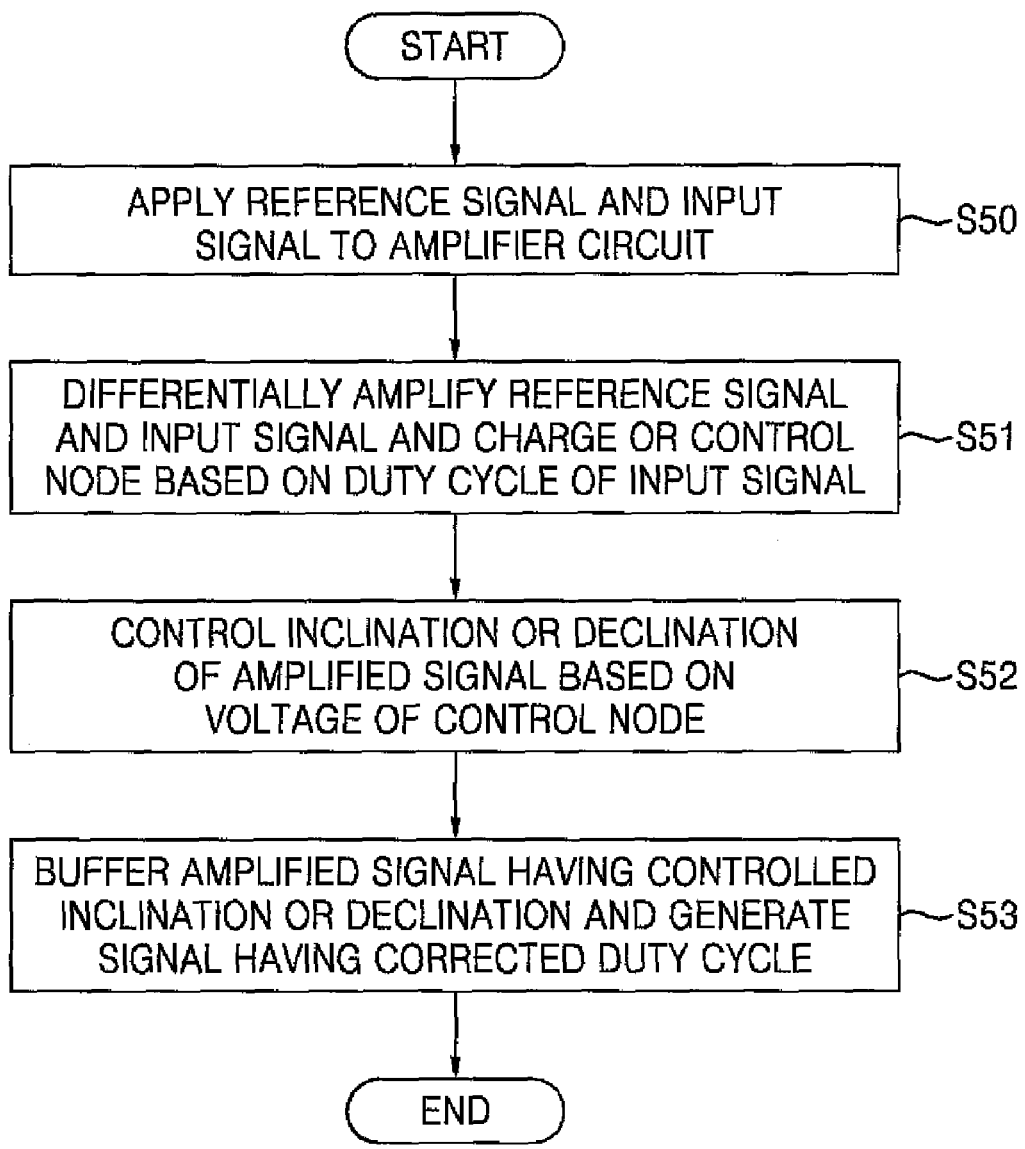
FIG. 5 is a flowchart summarizing a duty cycle correction method using a buffer according to certain embodiments of the inventive concept.

FIG. 4 is a timing diagram showing the operation of the buffer circuit 100 of FIG. 2. FIG. 5 is a flowchart summarizing a duty cycle correction method using the buffer circuit 100 according to certain embodiments of the inventive concept. Exemplary operation of the buffer circuit 100 will be described with reference to FIGS. 2 through 5.

The reference signal Vref and the input signal Din are applied to the amplifier circuit 110 (S50). Referring to FIG. 4, the duty cycle of the input signal Din is assumed to be within a range of 35% to 65%.

The amplifier circuit 110 differentially amplifies the reference signal Vref and the input signal Din and outputs the preliminary output signal Dout' to the driver circuit 130 and the duty control circuit, (i.e., the charge pump circuit 120 that charges/discharges the control node N_CS based on the duty cycle of the input signal Din) (S51). Referring to FIG. 4, there is distortion in the duty cycle of the preliminary output signal Dout' as provide by the amplifier circuit 110. Furthermore, the level of the control signal (e.g., voltage V_CS apparent at the control node N_CS) varies in accordance with change in the duty cycle of the input signal Din.

The first buffer element 132A of the driver circuit 130 receives the preliminary output signal Dout' from the amplifier circuit 110, and the control signal from the duty control circuit 120, and controls the inclination/declination of the preliminary output signal Dout' based on the control signal (S52). It can be seen in FIG. 4 that the inclination/declination of the preliminary output signal Dout' is changed by the first buffer element 132A according to the control signal.

The second buffer element 132B of the driver circuit 130 buffers the resulting adjusted preliminary output signal Dout' provided by the first buffer element 132A, and generates the output signal Dout having a corrected duty cycle of 50% (S53). Referring to FIG. 4, the output signal Dout obtained after duty cycle correction has a duty cycle of about 51.9%—which is very close to 50%.

Figure 6:
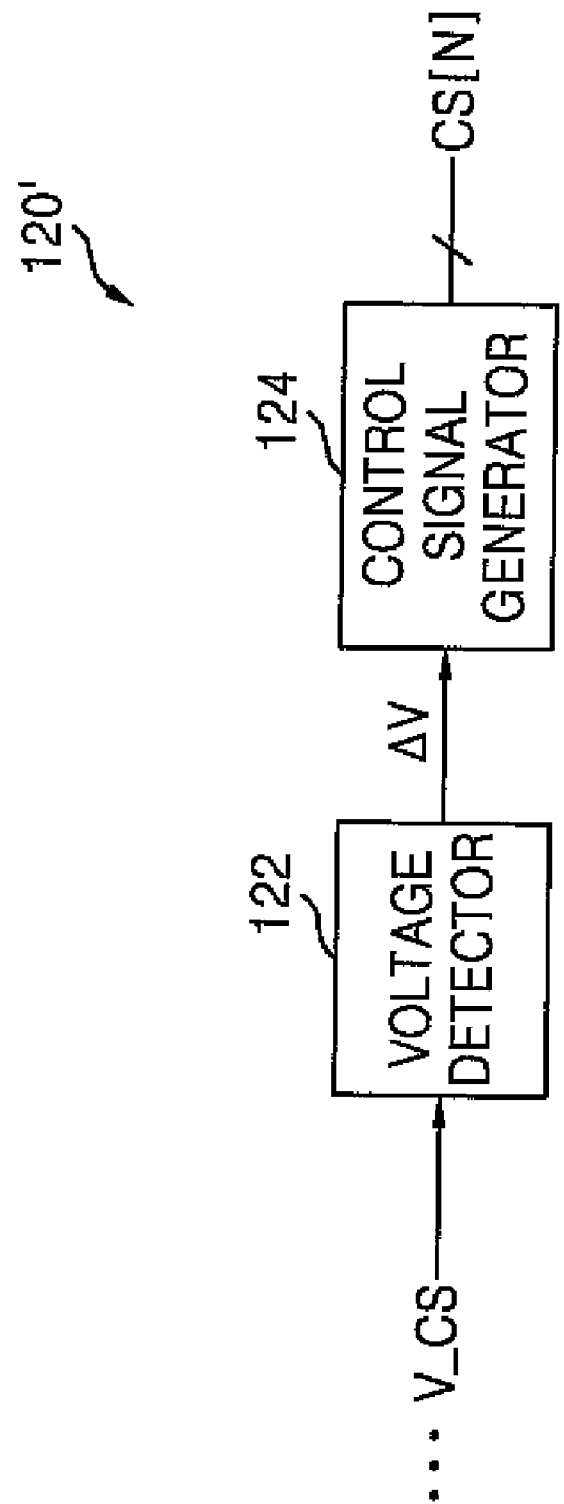
FIG. 6 is a general block diagram of a duty control circuit according to certain embodiments of the inventive concept.
Figure 7:
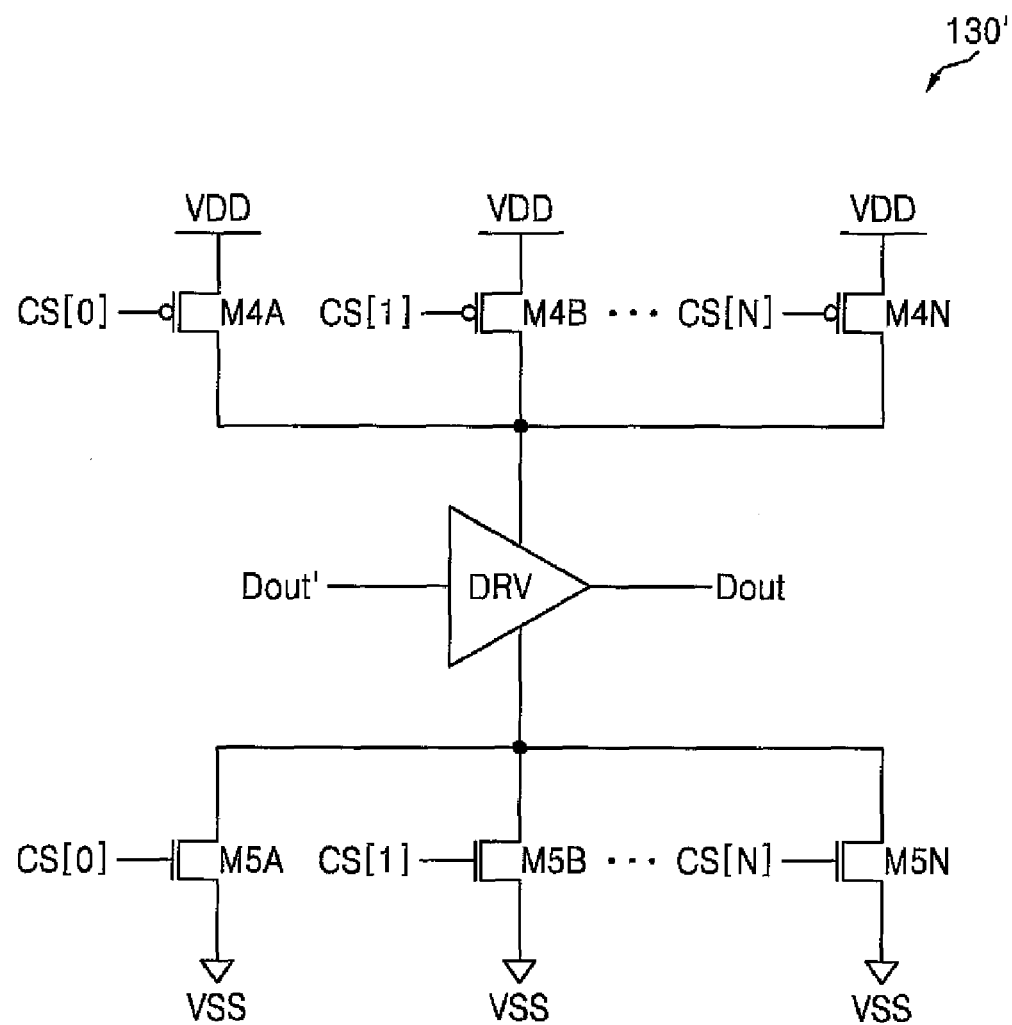
FIG. 7 is a circuit diagram further illustrating a driver circuit which corrects a duty cycle of an output signal of an amplifier circuit in response to a control signal output from the duty control circuit illustrated in FIG. 6.

FIG. 6 is a general block diagram of a duty control circuit 120' according to certain embodiments of the inventive concept. FIG. 7 is a circuit diagram further illustrating one possible implementation of a driver circuit 130' that may be used to correct the duty cycle of the preliminary output signal Dout' provided by the amplifier circuit 110 in response to a control signal CS[N] provided by the duty control circuit 120' of FIG. 6.

Referring to FIG. 6, the duty control circuit 120' comprises a voltage detector 122, which receives a control signal (e.g., voltage V_CS apparent at the control node N_CS) and detects change in the control signal that arises as a result of duty cycle distortion in the input signal Din. This detected change in the control signal is applied to a control signal generator 124 that generates a control signal CS[N] capable of correcting the duty cycle of the input signal Din based on the detected amount of change in the control signal (e.g., voltage V_CS). For instance, the duty control circuit 120' may detect the amount of change in the voltage V_CS apparent at the control node N_CS that arises from a duty cycle distortion in the input signal Din in relation to a reference duty cycle of 50%, and generate a digital control signal CS [N] including a plurality of bits based on the amount of detected change.

Referring to FIG. 7, the driver circuit 130' controls the inclination of the preliminary output signal Dout' provide by the amplifier circuit 110 using pull-up controller M4A through M4N operating in response to the control signal CS[N] and controls the declination of the preliminary output signal Dout' using pull-down controller M5A through M5N operating in response to the control signal CS[N], thereby correcting duty cycle distortion in the input signal Din.

As illustrated in FIG. 7, each of the pull-up controller M4A through M4N may be implemented using a PMOS transistor operating in response to a corresponding one bit among the bits in the control signal CS[N] and each of the pull-down controller M5A through M5N may be implemented by an NMOS transistor operating in response to a corresponding one bit among the bits in the control signal CS[N].

Figure 8:
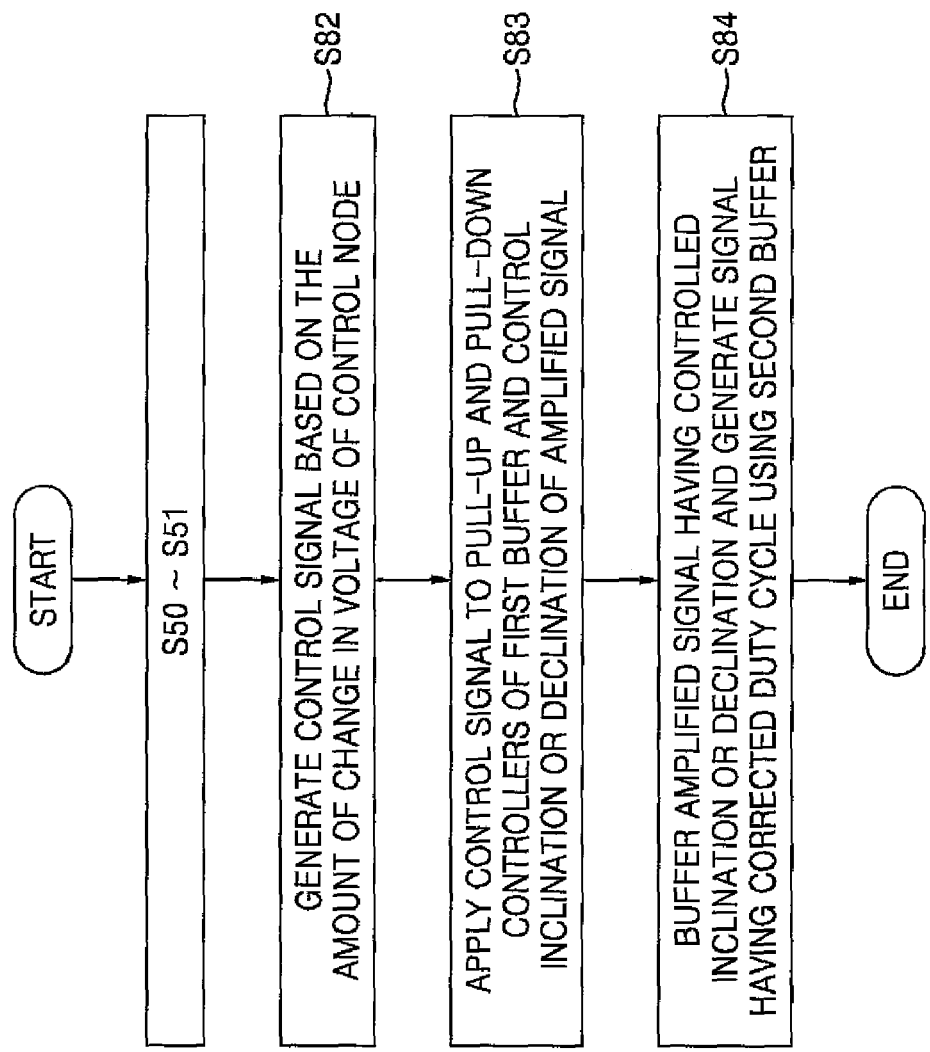
FIG. 8 is a flowchart summarizing a duty cycle correction method using a buffer according to certain embodiments of the inventive concept.

FIG. 8 is a flowchart summarizing a duty cycle correction method using the buffer circuit 100 including the duty control circuit 120' of FIG. 6 and the driver circuit 130' of FIG. 7 according to certain embodiments of the inventive concept. The method will be described with reference to FIG. 2 and FIGS. 6 through 8.

The amplifying operation of the amplifier circuit 110 based on the input signal Din and the reference signal Vref and the charge/discharge of the control node N_CS have been described with reference to FIG. 5. Thus, descriptions thereof will be omitted here.

The duty control circuit 120' detects the amount of change in the voltage V_CS of the control node N_CS, which occurs based on duty cycle distortion in the input signal Din against a reference duty cycle (e.g., a duty cycle of 50%) and generates the control signal CS[N] based on the amount of detected change (S82). Next, the buffer circuit 100 applies the control signal CS[N] to the pull-up controllers M4A through M4N and the pull-down controllers M5A through M5N of the first buffer element 132A included in the driver circuit 130' and controls the inclination/declination of the differentially amplified preliminary output signal Dout' provide by the amplifier circuit 110 (S83). Thereafter, the second buffer element 132B of the driver circuit 130' buffers the adjusted preliminary output signal Dout" provided by the first buffer element 132A, and generates the output signal Dout having a corrected duty cycle (S84).

Some embodiments of the inventive concept may be embodied, wholly or in part, using hardware, software, and/or firmware. When the duty cycle correction methods according to embodiments of the inventive concept are embodied in software, they may be embodied as computer readable codes and/or programs on a computer readable recording medium. The duty cycle correction methods according to embodiments of the inventive concept may be embodied by executing the computer program for executing the duty cycle correction methods stored in the computer readable recording medium.

The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices.

In the embodiments illustrated in FIGS. 1 through 8, duty cycle correction in a Bazes amplifier circuit that generates a bias voltage itself has been described. However, the scope of the present inventive concept is not restricted to those embodiments. For instance, correcting a duty cycle of an input signal according to the increase/decrease of branch current of an amplifier circuit, which changes based on the duty cycle of the input signal, and outputting a signal having the corrected duty cycle may also be applied to normal differential amplifier circuits.

Figure 9:
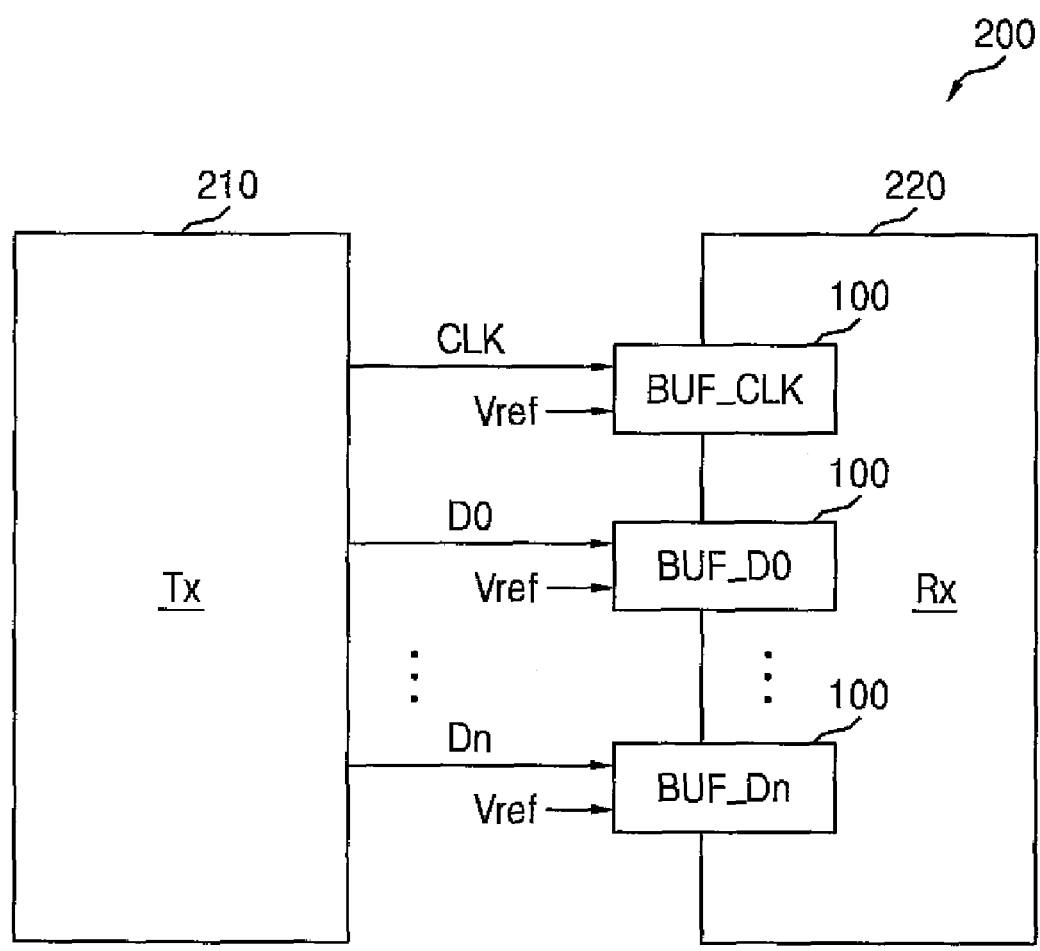
FIG. 9 is a block diagram of a semiconductor memory system incorporating a plurality of buffers according to certain embodiments of the inventive concept.

FIG. 9 is a block diagram of a semiconductor memory system 200 incorporating one or more buffer(s) according to certain embodiments of the inventive concept. The semiconductor memory system 200 generally comprises a transmitter 210 and a receiver 220. The receiver 220 may includes a semiconductor memory device, such as a dynamic random access memory (DRAM) device or a flash memory device, and the transmitter 210 may be a controller, but the inventive concept is not restricted thereto.

The transmitter 210 may transmit a clock signal CLK and data D0 through Dn to the receiver 220. The receiver 220 may store the data D0 through Dn in response to the clock signal CLK or may output the stored data D0 through Dn to the transmitter 210.

The duty cycle of the clock signal CLK and the data D0 through Dn must be maintained constant in order to prevent errors in data communication between the transmitter 210 and the receiver 220. To maintain the duty cycle constant, the receiver 220 uses the buffer circuit 100 as a buffer that receives the clock signal CLK and the data D0 through Dn from the transmitter 210. The clock signal CLK and the data D0 through Dn correspond to the input signal Din of the buffer circuit 100. Accordingly, the semiconductor memory system 200 according to the current embodiments of the present inventive concept can secure a satisfactory data setup margin and hold margin in the data communication between the transmitter 210 and the receiver 220. Part or all of each of the buffer circuit 100, a semiconductor memory device (e.g., the receiver 220 illustrated in FIG. 9) including the buffer circuit 100, and the semiconductor memory system 200 may be packaged using various methods.

For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and/or Wafer-Level Processed Stack Package (WSP), among others.

Figure 10:
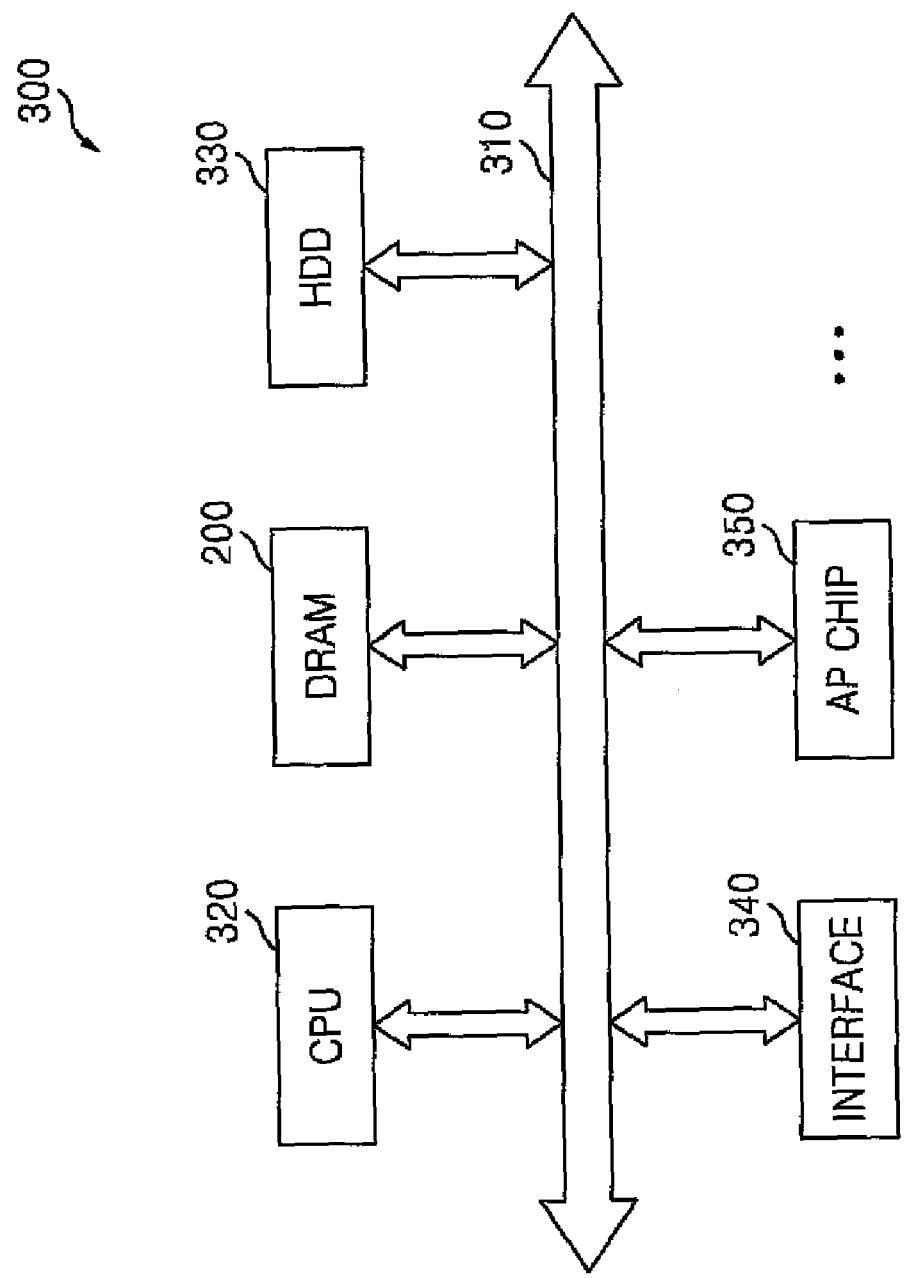
FIG. 10 is a general block diagram of an electronic system incorporating a semiconductor memory (e.g., DRAM 200) including one or more buffers according to certain embodiments of the inventive concept.

FIG. 10 is a block diagram of an electronic system 300 incorporating one or more semiconductor devices including one or more buffer(s) according to certain embodiments of the inventive concept. Referring to FIG. 10, the electronic system 300 generally comprises a central processing unit 320, the semiconductor memory system 200, e.g., DRAM, a hard disk drive (HDD) 330, a user interface 340, and an application chipset 350, which are electrically connected with one another through a system bus 310.

The electronic system 300 may be a computing system such as a notebook computer or a personal computer (PC) or a mobile device such as a cellular telephone, a personal digital assistant (PDA), a digital camera, a portable game console, or an MP3 player, but the present inventive concept is not restricted thereto.

The electronic system 300 may use the memory device, i.e., the DRAM 200 according to some embodiments of the inventive concept to temporarily store data necessary for the operations of the electronic system 300. That the DRAM 200 has more stable command execution performance without errors than conventional DRAMs has been described with reference to FIGS. 1 through 9 above. Accordingly, the electronic system 300 according to some embodiments of the inventive concept also has more stable operation characteristics than conventional electronic systems.

As described above, according to some embodiments of the inventive concept, the duty cycle of an input signal is corrected, so that a signal having a constant duty cycle is output.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A buffer circuit comprising:
an amplifier circuit receiving an input signal and a reference signal and configured to amplify a difference between the input signal and the reference signal, provide a branch current that varies with a duty cycle of the input signal, and output a preliminary output signal on the basis of the amplified difference;
a charge pump circuit configured to charge or discharge a control node in response to a change in the branch current, wherein a voltage apparent at the control node is output as a control signal; and
a driver circuit receiving the preliminary output signal and the control signal, and configured to control pull-up strength and pull-down strength for the preliminary output signal based on the control signal to thereby correct a duty cycle of the preliminary output signal in relation to a target duty cycle for the input signal.

2. The buffer circuit of claim 1, wherein the amplifier circuit comprises:
a constant current source configured to operate in response to a bias voltage internally generated in response to the reference signal; and
an amplification unit configured to amplify the difference between the input signal and the reference signal.

3. The buffer circuit of claim 2, wherein the charge pump circuit is connected to a common node between the constant current source and the amplification unit to charge or discharge the control node in response to the change in the branch current.

4. The buffer circuit of claim 1, wherein the amplifier circuit comprises:
a constant current source configured to operate in response to a bias voltage; and
an amplification unit configured to amplify the difference between the input signal and the reference signal.

5. The buffer circuit of claim 4, wherein the charge pump circuit is connected to a common node between the constant current source and the amplification unit to charge or discharge the control node in response to the change in the branch current.

6. The buffer circuit of claim 1, wherein the amplifier circuit comprises:
a first constant current source and a second constant current circuit configured to operate in response to a bias voltage internally generated in response to the reference signal; and
an amplification unit configured to amplify the difference between the input signal and the reference signal.

7. The buffer circuit of claim 6, wherein the charge pump circuit comprises:
a first charge pump connected to a first common node between the first constant current source and the amplification unit and configured to discharge the control node in response to the reference signal; and
a second charge pump connected to a second common node between the second constant current source and the amplification unit and configured to charge the control node in response to the reference signal.

8. The buffer circuit of claim 1, wherein the driver circuit comprises:
  a first buffer element configured to control an inclination/declination of the preliminary output signal in response to the control signal and output an adjusted preliminary output signal; and
  at least one second buffer element configured to buffer the adjusted preliminary output signal and output an output signal.

9. The buffer circuit of claim 8, wherein the driver circuit further comprises:
  a pull-up controller configured to increase inclination of the preliminary output signal by increasing pull-up strength of the first buffer element in response to control signal; and
  a pull-down controller configured to increase declination of the preliminary output signal by increasing pull-down strength of the first buffer element in response to the control signal.

10. A buffer circuit comprising:
  an amplifier circuit receiving an input signal and a reference signal and configured to amplify a difference between the input signal and the reference signal, provide a branch current that varies with a duty cycle of the input signal, and output a preliminary output signal on the basis of the amplified difference;
  a duty control circuit configured to generate a control signal that varies with the branch current; and
  a driver circuit receiving the preliminary output signal and the control signal, and configured to control inclination/declination of the preliminary output signal in response to the control signal to correct the a duty cycle of the preliminary output signal in relation to a target duty cycle for the input signal.

11. The buffer circuit of claim 10, wherein the amplifier circuit comprises:
  a constant current source configured to operate in response to an external bias voltage or a bias voltage internally generated in response to the reference signal; and
  an amplification unit configured to amplify the difference between the input signal and the reference signal,
  wherein the duty control circuit is connected to a common node between the constant current source and the amplification unit to generate the control signal based on a change of a branch current in the amplification unit that varies in relation to the duty cycle of the input signal.

12. The buffer circuit of claim 10, wherein the duty control circuit comprises:
  a charge pump circuit configured to charge or discharge a control node in response to the branch current, wherein the control signal is generated in response to a voltage apparent at the control node.

13. The buffer circuit of claim 12, wherein the duty control circuit further comprises:
  a voltage detector receiving the voltage apparent at the control node and configured to output a detected control voltage signal; and
  a control signal generator receiving the detected control voltage signal and configured to output a digital control signal indicative of the detected control voltage signal.

14. The buffer circuit of claim 13, wherein the driver circuit comprises:
  a pull-up controller operating in response to the digital control signal to control inclination of the preliminary output signal; and
  a pull-down controller operating in response to the digital control signal to control declination of the preliminary output signal.

15. A method of correcting a duty cycle using a buffer circuit receiving an input signal and a reference signal, the method comprising:
  amplifying a difference between the input signal and the reference signal to generate a preliminary output signal;
  generating a branch current that varies with a duty cycle of the input signal, and charging or discharging a control node in response to the branch current;
  generating a control signal from a voltage apparent at the control node; and
  correcting a duty cycle for the preliminary output signal in relation to a target duty cycle for the input signal by controlling pull-up strength and pull-down strength of the preliminary output signal in response to the control signal.

16. The method of claim 15, wherein generating the control signal comprises:
  using a charge pump circuit charging or discharging the control node in response to the branch current, wherein the control signal is generated in response to the voltage apparent at the control node.

17. The method of claim 15, further comprising:
  generating an output signal from the preliminary output signal by controlling inclination/declination of the preliminary output signal in response to the control signal and output an adjusted preliminary output signal; and
  buffering the adjusted preliminary output signal.

* * * * *